United States Patent [19]

Caslavsky et al.

[11] Patent Number: 4,510,609
[45] Date of Patent: Apr. 9, 1985

[54] FURNACE FOR VERTICAL SOLIDIFICATION OF MELT

[75] Inventors: Jaroslav L. Caslavsky, Lexington, Mass.; Gerald H. Lavoie, Pembroke, N.H.; William H. Earle, Randolph; Dennis J. Viechnicki, Wellesley, both of Mass.

[73] Assignee: The United States of America as represented by the Secretary of the Army, Washington, D.C.

[21] Appl. No.: 575,613

[22] Filed: Jan. 31, 1984

[51] Int. Cl.³ .............................................. H05B 3/40
[52] U.S. Cl. ................................... 373/110; 373/117; 373/128
[58] Field of Search .............. 373/110, 111, 112, 117, 373/128, 133, 135, 136, 122

[56] References Cited

U.S. PATENT DOCUMENTS 3,004,090 10/1961 Donovan et al. .................. 373/110
3,395,241 7/1968 Roman .............................. 373/128

Primary Examiner—A. D. Pellinen
Assistant Examiner—Susan Steward
Attorney, Agent, or Firm—Anthony T. Lane; Robert P. Gibson; Lawrence E. Labadini

[57] ABSTRACT

A furnace for growing large single crystals from materials having high melting temperatures using the vertical solidification of melt method. The crucible containing the melt being encased in a muffle with vertically oriented heating rods arranged in a circular pattern around the outside of the muffle. The tops of the heating rods being electrically connected to a continuous graphite ring, and the bottoms of equal numbers of rods being electrically connected to two semi-circular sections of graphite. The power feeds for the heating rods being vertically brought into the furnace from the bottom for electrical connection to the semi-circular sections of graphite.

7 Claims, 2 Drawing Figures

FURNACE FOR VERTICAL SOLIDIFICATION OF MELT

The invention described herein may be manufactured, used and licensed by or for the United States Government for governmental purposes without the payment to us of any royalty thereon.

BACKGROUND OF THE INVENTION

This invention relates to high temperature furnaces for the growth of crystals having minimal structural imperfections. More particularly, the present invention is for an improved high temperature furnace for the growth of crystals where non-crystalline or polycrystalline material is first melted in an upright crucible having cylindrical symmetry. The crucible is maintained by the furnace in a thermal environment having radial symmetry perpendicular to the vertical axis of the crucible. Starting from the base of the crucible where a seed crystal is positioned, and continuing along the vertical axis, the temperature of the molten material is slowly lowered to induce crystal growth. During crystal growth, however, thermal gradients in the furnace are controlled such that at every plane perpendicular to the vertical axis of the crucible no thermal gradients are present. Therefore, the latent heat of fusion is extracted from the melt in such a spatial and temporal relationship as to result in crystal growth from the base of the crucible to the top of the melt with a flat planar solid-liquid interface. This technique is referred to herein as the vertical solidification of melt (VSOM).

Several substantial industries are dependent on the production of large single crystals having high melting temperatures. To be useful these crystals must often be essentially free of structural defects. Such industries include those of: semiconductor electronics, where crystalline silcon, gallium arsenide and other materials are the beginning resource from which sophisticated electronic devices are manufactured; and, quantum electronics, where lasers are manufactured using for example, crystalline laser rods fabricated from $Al_2O_3$ doped with chromium (ruby), or yttrium aluminum garnet doped with neodymium (Nd:YAG).

A widely used technique for growing such single crystals, i.e. boules, is the Czochralski method. This method involves the melting in a crucible of a purified meltstock, suitably doped, from which the single crystal is to be grown. Then a seed crystal having a predetermined orientation is dipped into the melt, and the heat input provided by the furnace to the melt is reduced while the seed crystal is rotated and slowly withdrawn from the melt. Unavoidable limitations imposed by the mechanics of withdrawing the boule from the melt are boule size limitations, faceted growth, and strained cores.

Due to the time, expense, and complexity involved in growing single crystals, increasing the size of produced boules becomes one of the more sought after features. For the larger the boule the more electronic devices or laser rods, for example, can be fabricated from a single boule. An unacceptable trade off, however, in attempting to achieve larger boule size is the introduction of imperfections in the boule's crystal structure. A technique which has been used to grow larger single crystals mainly from single component systems, e.g. sapphire, while at the same time trying to achieve high crystalline structural regularity is a so called heat exchange method (HEM). By this method, instead of withdrawing a seed crystal from the melt, a seed crystal is positioned in the melt at the base of the crucible above a helium cooled heat exchanger. The melt is kept at a constant temperature while growth of the crystal is controlled by the thermal gradient within the solid. In order to sustain growth, the thermal gradient within the solid has to be continuously increased. In a homogenous melt, heat propagation is in a straight path. Therefore, the solid-liquid interface at the beginning of the solidification takes a hemispherical shape and as growth progresses, the solid-liquid interface becomes more and more convex leading to a paraboloid-like shape in the last stages of the solidification process. The HEM has been found not to be suitable for the growth of large diameter laser quality single crystals of compositions which belong to binary systems, whose melting behavior is characterized by a steep liquidus.

To grow large diameter quality single crystals of compositions which belong to binary or even more complicated systems, the present invention utilizes a technique which can be described as the vertical solidification of melt (VSOM). In this technique, solidification commences at the bottom of a crucible containing the melt and continues in a vertical direction while maintaining planar solid-liquid interface until crystal growth is completed. A planar solid-liquid interface is essential for growing good quality single crystals but such an interface is difficult to maintain during the entire period of growth of a large diameter single crystal. VSOM requires the formation of a thermal field within the crucible whose isotherms must be parallel with the bottom of the crucible and have an upward gradient. The temperature within the liquid melt is slowly lowered allowing solidification about the seed crystal. The latent heat of crystallization is removed from the system by flowing through the crystallized solid into a heat sink. The heat flow through the heat sink must be equal to the net heat flow through the flat liquid-solid interface conducted through the already crystallized charge.

SUMMARY OF THE INVENTION

In order to grow large high quality single crystals by the VSOM method, it is necessary for the crucible containing the melt to be maintained in a thermal environment where, though, the temperature at the bottom of the crucible is lower then that at the top of the crucible there are essentially no thermal gradients in planes perpendicular to the vertical axis of the crucible. This cylindrically symmetrical thermal distribution assures that as heat is withdrawn from the crucible and crystal growth proceeds a flat planar solid-liquid interface perpendicular to the vertical axis of the crucible is maintained. Such a solid-liquid interface geometry is important to the growth of boules having high crystalline structural regularity. For example, Nd:YAG boules, from which laser rods are fabricated, can be grown using the VSOM method, but the maintenance of a flat planar solid-liquid interface has been found to be an important parameter for controlling crystal quality.

In accordance with the present invention a cylindrical crucible is mounted on a heat sink base within a high temperature furnace. The heating elements used for the furnace are graphite rods vertically mounted in a circular symmetrical pattern about the crucible. The rods are all connected at their base to high current electrical sources. In order to not only avoid the generation of hot spots but also to minimize a symmetrical heat loss through the electrical connections to the graphite heating rods, the electrical connections are brought vertically into the furnace from the bottom via multiple water cooled power feeds. The power feeds are connected to split semi-circular graphite rings which are, in turn, attached to the bottom ends of the graphite rods. To complete the electrical circuits all of the graphite rods are fastened at their top ends to a circular graphite ring. The number of graphite heating rods is selected so as to minimize the development of thermal gradients about the encircled crucible.

Positioned between the graphite heating rods and the crucible is a cylindrical graphite muffle. This muffle acts as a black body enclosure to further provide a uniform thermal environment for the crucible. Heat radiated by the graphite rods is absorbed by the muffle and transmitted through the mass of the graphite muffle thus attenuating thermal spatial gradients. The heat is then, in part, uniformly radiated from the interior wall of the muffle into the chamber containing the crucible. This combination of vertically mounted graphite heating rods with a uniform distribution of power feeds from the bottom of the furnace, and intervening cylindrical muffle produces a cylindrically symmetrical thermal environment for the crucible.

With a seed crystal properly oriented at the base of the crucible and meltstock located in the crucible, the thermal flux provided by the furnace melts the meltstock while the heat sink withdraws sufficient heat to prevent the seed crystal from being completely melted. Some melting of the seed crystal, though, is permitted, and such melting is desirable because this melting promotes good growth. In order to monitor and thereby control the thermal environment of the hot zone two optical pyrometers are mounted outside the furnace. One optical pyrometer having an optical path to the muffle exterior wall and the other optical pyrometer having an optical path to the melt. Linearizing the current outputs of the two optical pyrometers with respect to temperature and then differentiating these two linearized signals provides an accurate method for monitoring the thermal state of the melt. Using these signals the electrical current supplied to the graphite heating rods can accordingly be controlled.

BRIEF DESCRIPTION OF THE DRAWINGS

The various objects, advantages and novel features of the present invention will be more readily apprehended from the following detailed description when read in conjunction with the appended drawings, in which.

DETAILED DESCRIPTION OF THE INVENTION

Figure 1:
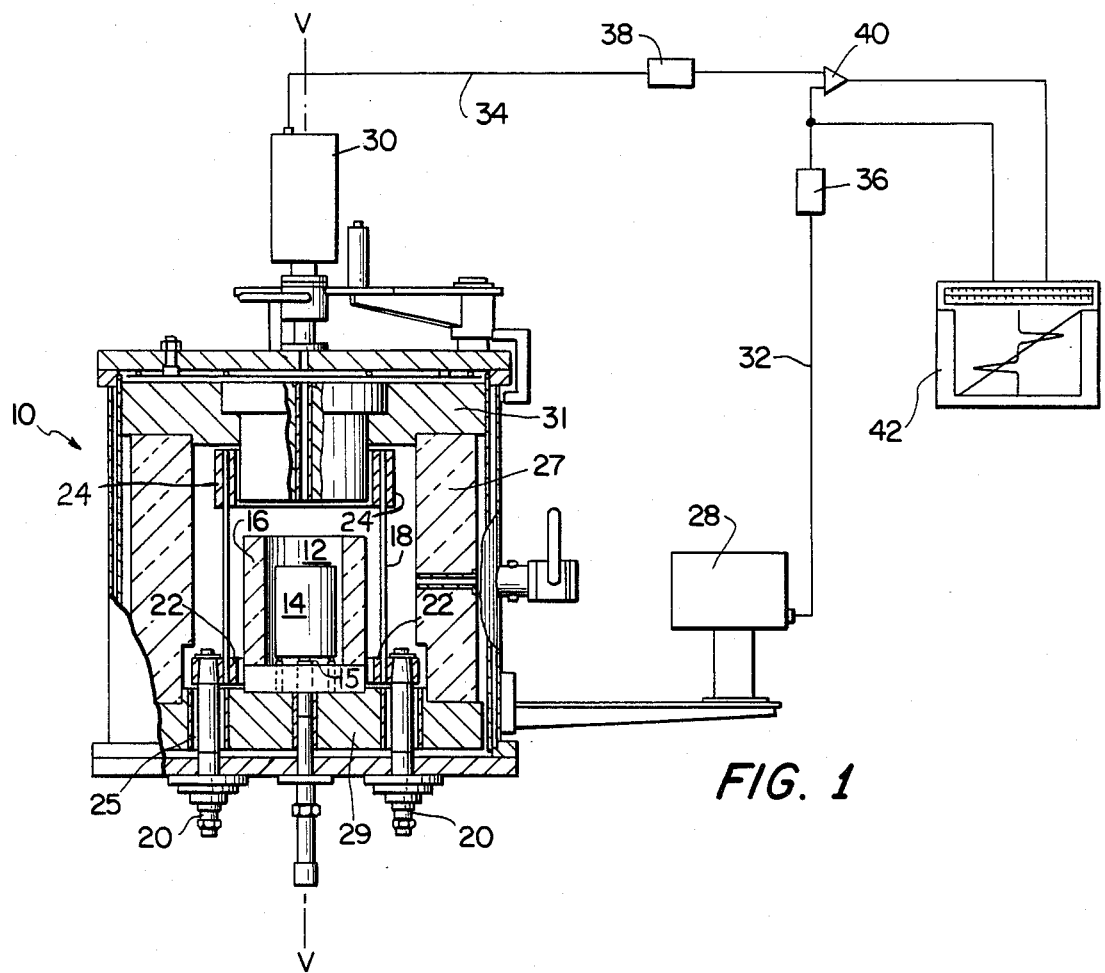
FIG. 1 illustrates a sectional elevational view of the furnace in accordance with the present invention with a schematic presentation of associated optical and electronic monitoring and control equipment; and, FIG. 2 is a perspective view of the configuration of the graphite heating rods attached to the top graphite ring and bottom graphite ring sections with power feeds.

Referring now to the drawings, wherein corresponding components are designated by the same reference numerals throughout the various figures, a gas-tight furnace according to the invention is illustrated in FIG. 1 and generally designated by reference numeral 10. Furnace 10 includes hot zone 12 in which is mounted crucible 14 on heat sink 15. Surrounding crucible 14 is muffle 16. Positioned in a circular arrangement about muffle 16 are heating rods 18 with cooled power feeds 20 connected to semi-circular graphite ring sections 22. The configuration of heating rods 18, circular graphite ring sections 22, and top graphite ring 24 is shown in perspective in FIG. 2. As shown in FIG. 1, the crucible 14, muffle 16, heating rods 18, ring 24 and ring sections 22 are inclosed within a chamber defined by graphite thermal insulation pieces, 27, 29 and 31.

Figure 2:
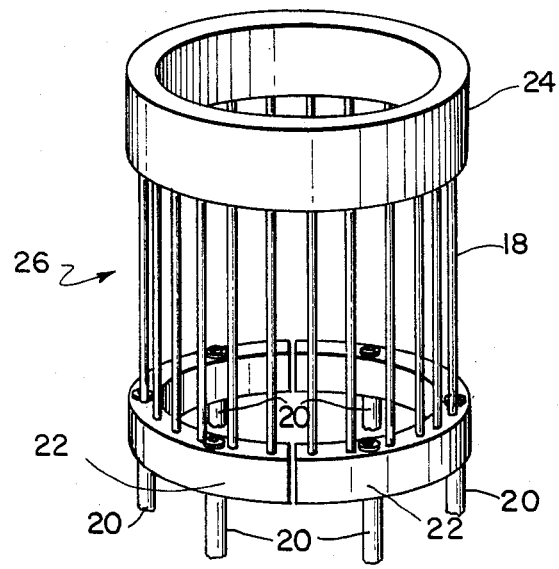

The arrangement shown in FIG. 2 for the heating rods 18 can be described as a bird cage configuration 26. For a preferred embodiment of a furnace utilizing the present invention in which Nd:YAG boules and other high melting materials are to be grown, the hot zone 12 has to be heated to temperatures in the range of 1500° C. to 2200° C. For such a furnace it has been found that dense pure and strong graphite rods sold under the name POCO graphite and manufactured by Poco Graphite, Inc., Decatur, Tex. can be used for the heating rods 18. Further, for such a furnace forty six (46) graphite heating rods 18 which are 0.953 centimeters in diameter have been arranged in a bird cage configuration with a diameter of 215.4 centimeters between opposite graphite heating rods 18. This bird cage configuration 26 has forty six (46) POCO graphite heating rods 18 connected at their top ends to a top graphite ring 24 and at their bottom ends to two (2) semi-circular graphite ring sections 22. The top ring 24 and the ring sections 22 are fabricated from ATJ graphite manufactured by Union Carbide Corp. Such a bird cage configuration provides an adequate and uniform heat flux when supplied with 2200 amperes of electrical current through one of the semi-circular graphite ring sections 22 with the remaining electrically separate semi-circular graphite section 22 being used for electrical returns. Since the hot zone 12 has to be heated to temperatures in the range of 1500° C. to 2200° C., in order to grow Nd:YAG boules, the power feeds 20 have to be water cooled. The positioning of these water cooled power feeds 20 thus becomes a critical furnace design feature, because both circumferential and vertical thermal gradients will be created by the heat loss resulting from the cooled power feeds 20. By locating the power feeds 20 at the bottom of the furnace 10, and by distributing a sufficient number of the power feeds 20 in a symmetrical pattern, for example six power feeds 20, the heat loss and resulting thermal gradients caused by power feeds 20 have been found to be effectively minimized. In the temperature range between 1500° C. and 2200° C. the power feeds 20 would leak significant amounts of heat if the power feeds were attached at right angles to the graphite sections 22 and had to pass through graphite thermal insulation 27. Since the insulation is conductive, the diameter of the port in the insulation would have to be greater than the diameter of the power feeds to prevent electrical short circuits thereby allowing leakage of heat through the openings. If the water cooled power feeds 20 were to be connected to the top ring 24, they would act as heat sinks to cause heat loss creating significant downward vertical thermal gradients in the hot zone 12. The generation of such unwanted thermal gradients is substantially reduced by attaching the power feeds 20 to circular graphite sections 22 in an arrangement where the power feeds 20 ar parallel to the vertical axis V-V of furnace 10 and pass through the ports 25 in the thermal insulation 29 which forms the horizontal floor beneath the bird cage configuration 26.

To further enhance the thermal stability and uniformity of the hot zone 12 beyond that provided by the bird cage configuration 26 of the heating rods 18, and the six symmetrically positioned cooled power feeds 20 brought through the bottom of furnace 10, a graphite muffle 16 is positioned between crucible 14 and the bird cage configuration 26. In a preferred embodiment of furnace 10 the wall of muffle 16 is of uniform thickness, and muffle 16 is fabricated of ATJ graphite, which as identified above is sold by Union Carbide Corporation. As is known in the art calculations can be executed to determine non-uniform wall thicknesses for muffle 16 depending on the thermal environment to be maintained in hot zone 12. The function of muffle 16 includes shielding heating rods 18 from volatile constituents coming from the melt contained in crucible 14, and the thermal function of shielding hot zone 12 from gradients caused by heating rods 18.

For growth of Nd:YAG boules, the electrical power provided by water-cooled power feeds 20 to graphite heating rods 18 is controlled by monitoring both the temperature of the melt and of the muffle 16. The equipment for such monitoring is schematically illustrated in FIG. 1 and described in more detail in an article by J. L. Caslavsky and D. J. Viechnicki in J. Mater. Sci. 15 (1980) 1709–1718 which is incorporated herein by reference. At temperatures below 1500° C. the temperature of hot zone 12 can be controlled by monitoring the electrical power supplied to power feeds 20. However, at temperatures above 1500° C. in hot zone 12 the electrical power supplied to power feeds 20 must be controlled using the signals provided by optical pyrometers 28 and 30. Optical pyrometer 28 which monitors the temperature of the exterior wall of muffle 16 is a two-color pyrometer, while optical pyrometer 30 which monitors the melt temperature in the crucible 14 is a single color pyrometer. Since the electrical signals generated by optical pyrometers 28 and 30 are non-linear functions of temperature, these signals which are conducted through electrical conductors 32 and 34 are linearized by signal conditioners 36 and 38. With such linearization the temperature of hot zone 12 and the temperature of the melt in crucible 14 can be accurately monitored and the necessary electrical power to power feeds 20 can be provided. Further, by differentiating the linearized signals from optical pyrometers 28 and 30 using differentiator 40 the optical differential thermal analysis curve can be recorded on plotter 42. For melts such as Nd:YAG, which generate endothermic and exothermic peaks at temperatures in the thermal region of melting and freezing, respectively, this optical differential thermal analysis curve provides important data necessary for production of high quality crystals.

To commence solidification at a single point and in a single crystalline mode, a seed crystal is placed in the center of the bottom of the crucible 14 directly over heat sink 15. Heat sink 15 which is water cooled prevents melting of the seed crystal, removes the latent heat of solidification and functions in part to control crystal growth. It has been determined that the surface area of the heat sink should be approximately 1/15 of the area of the solid melt interface. In order to start the growth of the crystal, the temperature of the muffle 16 is slightly lowered. Since the heat capacity of the content of crucible 14 is significantly higher than the muffle heat capacity, a temperature difference occurs between the muffle and the melt. This difference which is seen by optical pyrometers 28 and 30 is translated to an appropriate electrical signal and fed into a microprocessor (not shown) whose program is designed to control the temperature decrease of the muffle 16 as a function of the difference between the temperature of the muffle and the surface of the melt. In other words, the rate of temperature decrease of the muffle is controlled by the program as a function of the temperature difference between the crucible content and the muffle. During solidification of crystals with large cross section a significant amount of latent heat is developed at the interface which latent heat influences the melt temperature. This change is sensed by pyrometer 30 whose signal in turn corrects the signal of pyrometer 28. This type of control enables programming the propagation of the thermal field with an accuracy of $\pm 1°$ C. in the temperature range between 1500° C. to 2200° C. and the rates of temperature decrease between 2.0° and 0.1° C. per hour, therefore, the temperature of the thermal field, measured at any point along the vertical axis of the field can be controlled with an accuracy of $\pm 1°$ C. in the given range. The temperature at such a point can be either decreased or increased as slowly as 0.1° C. per hour linearly in the given range. This provides a very accurate control for crystal growth.

Because the birdcage configuration 26 operates at high temperatures requiring a high electric current, the power feeds 20 have to be cooled by water. These power feeds act as heat sinks and produce an upward thermal gradient of about 1.0° per mm over the 120 mm length of crucible 14. The upward (vertical) thermal gradient is controlled by the heat loss produced by the degree of cooling accomplished by the flow of water through the power feeds near the base of the crucible and the heat sink. The rate of flow of water is determined by the computer program which responds independently for each power feed and heat sink to the temperature of the outflowing water as measured by sensors known in the art, e.g , resistance temperature devices.

To protect the components of the furnace, a low vacuum of the order of $5 \times 10^{-2}$ *torr.* is employed.

Although the present invention has been described with reference to a preferred embodiment, it is to be understood that the invention is not limited to the details thereof. A number of possible modifications and substitutions have been suggested in the course of the foregoing detailed description, and others will occur to those of ordinary skill in the art. All such modifications and substitutions are intended to fall within the scope of the invention as defined in the appended claims.

What is claimed is:

1. A gas-tight furnace for growing crystals from high temperature melts using the vertical solidification of melt technique comprising:
    (A) a cylindrical crucible open at its top, mounted on a heat sink, for containing said melt;
    (B) a cylindrical muffle spaced from and surrounding said crucible;
    (C) vertically mounted heating rods spaced from said muffle and essentially uniformly spaced around the exterior of said muffle in a circular configuration;
    (D) an electrically conducting continuous top ring which is electrically connected to the top of all of said heating rods;
    (E) separate semi-circular ring sections electrically connecting said heating rods at their bottom ends;

(F) a thermal insulating layer of electrically conductive graphite completely enclosing elements (A) through (E) within said furnace; and, (G) more than two electrically conducting power feeds brought from the exterior of said furnace and passing vertically through openings in said electrically conductive insulation in the bottom of said furnace to essentially vertical electrical connection with said separate semi-circular rings and having essentially uniformly spaced distances between each power feed to deliver electric current into and out of said furnace to develop heat in the heating rods, wherein the thermal environment is maintained so that there are essentially no thermal gradients in planes perpendicular to the vertical axis of the crucible.

2. A furnace as set forth in claim 1 in which said muffle, heating rods, top ring and semi-circular ring sections are constructed of graphite.

3. A furnace as set forth in claim 2 in which six (6) power feeds are brought from the bottom of said furnace in a path essentially parallel to the vertical axis of the furnace to essentially vertical electrical connection with said separate semi-circular ring sections at essentially uniformly spaced distances between each of said 6 power feeds.

4. A furnace as set forth in claim 3 wherein three (3) of said power feeds bring electrical current into one of said semi-circular ring sections and three (3) of said power feeds bring the current out of the other of said semi-circular ring sections.

5. A furnace as set forth in claim 4 wherein the openings in said electrical conductive insulation at the bottom of said furnace are oversized to prevent electrical current from flowing thereto from said power feeds.

6. A furnace as set forth in claim 5 having means for monitoring the temperature of said muffle and said high temperature melt within said crucible.

7. A furnace as set forth in claim 6 wherein said power feeds are water cooled and act as heat sinks to remove heat from within said furnace to produce an upward thermal gradient along the vertical axis of the crucible.

* * * * *